United States Patent
Kim et al.

(10) Patent No.: US 10,553,677 B2
(45) Date of Patent: Feb. 4, 2020

(54) SEMICONDUCTOR WAFER HAVING BEVEL PORTION

(71) Applicant: SAMSUNG ELECTRONICS CO., LTD., Suwon-si (KR)

(72) Inventors: Yeon-sook Kim, Hwaseong-si (KR); In-ji Lee, Seoul (KR); Doek-gil Ko, Yongin-si (KR); Woo-seung Jung, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/035,170

(22) Filed: Jul. 13, 2018

(65) Prior Publication Data

US 2019/0198613 A1 Jun. 27, 2019

(30) Foreign Application Priority Data

Dec. 27, 2017 (KR) .................. 10-2017-0181523

(51) Int. Cl.
*H01L 23/58* (2006.01)
*H01L 29/06* (2006.01)

(52) U.S. Cl.
CPC .................. *H01L 29/0661* (2013.01)

(58) Field of Classification Search
CPC .......... H01L 21/02021; H01L 29/0661; H01L 33/20
USPC ...................................................... 257/496
See application file for complete search history.

(56) References Cited

U.S. PATENT DOCUMENTS

| 6,953,948 B2* | 10/2005 | Sakaguchi ............ H01L 23/544 257/347 |
| 7,258,931 B2 | 8/2007 | Kim et al. |
| 7,759,259 B2 | 7/2010 | Ito |
| 8,409,992 B2* | 4/2013 | Moeckel ........... H01L 21/02021 257/E21.219 |
| 8,551,862 B2 | 10/2013 | Akiyama et al. |
| 8,928,120 B1* | 1/2015 | Liu ....................... H01L 23/562 257/452 |
| 9,136,344 B2 | 9/2015 | Tomabechi |
| 2009/0142916 A1 | 6/2009 | Prenz et al. |

(Continued)

FOREIGN PATENT DOCUMENTS

| JP | 10-270298 A | 10/1998 |
| JP | 2002-320901 A | 11/2002 |
| JP | 2002-356398 A | 12/2002 |

(Continued)

*Primary Examiner* — Luan C Thai
(74) *Attorney, Agent, or Firm* — Sughrue Mion, PLLC

(57) ABSTRACT

A semiconductor wafer is provided. The semiconductor wafer includes a wafer body including a first surface and a second surface opposite the first surface; and a bevel portion disposed along an outer circumference of the wafer body and including an inclined surface, an outermost point, a first surface end portion connecting the bevel portion to the first surface and a second surface end portion connecting the bevel portion to the second surface. A first bevel angle between a first tangential direction of the inclined surface and the first surface corresponds to a capillary force of a fluid on the first surface, and a first bevel length between the first surface end portion and the outermost point along a first direction substantially parallel to the first surface corresponds to a first surface flatness.

18 Claims, 17 Drawing Sheets

(56) References Cited

U.S. PATENT DOCUMENTS

2015/0001682 A1    1/2015  Liu et al.
2017/0200683 A1*  7/2017  Kim .................. H01L 21/02013

FOREIGN PATENT DOCUMENTS

| | | |
|---|---|---|
| JP | 2003-229340 A | 8/2003 |
| JP | 2004-214489 A | 7/2004 |
| JP | 2006-24840 A | 1/2006 |
| JP | 2007-214256 A | 8/2007 |
| JP | 2007-266043 A | 10/2007 |
| JP | 2008-277696 A | 11/2008 |

* cited by examiner

US 10,553,677 B2

SEMICONDUCTOR WAFER HAVING BEVEL PORTION

CROSS-REFERENCE TO RELATED APPLICATION

This application claims priority from Korean Patent Application No. 10-2017-0181523, filed on Dec. 27, 2017 in the Korean Intellectual Property Office, the disclosure of which is incorporated herein by reference in its entirety.

BACKGROUND

Methods and apparatuses consistent with example embodiments relate to a semiconductor wafer, and more particularly, to a semiconductor wafer having a bevel portion.

A semiconductor chip (semiconductor integrated circuit) may be manufactured by performing a semiconductor manufacturing process on a semiconductor wafer. The semiconductor manufacturing process includes a thin film deposition process, a photoresist film coating process, an etching process, and an ion injection process. When a semiconductor manufacturing process is performed, a thin film or a photoresist film remains on a bevel portion (inclined portion or edge portion) located at an outer circumference (surroundings) of a semiconductor wafer, and thus manufacturing yield may be lowered as the remaining thin film or photoresist film acts as a defect.

SUMMARY

Example embodiments provide a semiconductor wafer which may improve semiconductor manufacturing yield by optimizing the shape or size of a bevel portion located at an outer circumference of a wafer body.

According to an aspect of an example embodiment, there is provided a semiconductor wafer including: a wafer body including a first surface and a second surface opposite the first surface; and a bevel portion disposed along an outer circumference of the wafer body and including an inclined surface, an outermost point, a first surface end portion connecting the bevel portion to the first surface and a second surface end portion connecting the bevel portion to the second surface. A first bevel angle between a first tangential direction of the inclined surface and the first surface corresponds to a capillary force of a fluid on the first surface, and a first bevel length between the first surface end portion and the outermost point along a first direction substantially parallel to the first surface corresponds to a first surface flatness.

According to an aspect of another example embodiment, there is provided a semiconductor wafer including: a wafer body including a first surface and a second surface opposite the first surface; and a bevel portion formed along an outer circumference of the wafer body and including an inclined surface connecting the first surface and the second surface. The bevel portion meets the first surface at a first point, the bevel portion meets the second surface at a second point, and an outermost portion of the inclined surface corresponds to a third point configured to contact an external contact member, and a bevel length is formed between a first virtual straight line extending from the first point to the second point and a second virtual straight line contacting the third point and parallel to the first virtual straight line.

According to an aspect of another example embodiment, there is provided a semiconductor wafer including: a wafer body including a first surface and a second surface opposite the first surface; a notch portion formed along an outer circumference of the wafer body towards a center portion of the wafer body; and a bevel portion formed along the outer circumference of the wafer body and including an inclined surface connecting the first surface and the second surface. The bevel portion meets the first surface at a first point, the bevel portion meets the second surface at a second point, and an outermost portion of the inclined surface corresponds to a third point configured to contact an external contact member, the inclined surface is located within a virtual circle circumscribing the third point, a center of the virtual circle being located in the wafer body, and wherein a first bevel angle is formed between the first surface and a first tangent line contacting the bevel portion at the first point.

BRIEF DESCRIPTION OF THE DRAWINGS

The above and other aspects, features, and advantages will be more clearly understood from the following detailed description taken in conjunction with the accompanying drawings in which.

DETAILED DESCRIPTION

Figure 1:
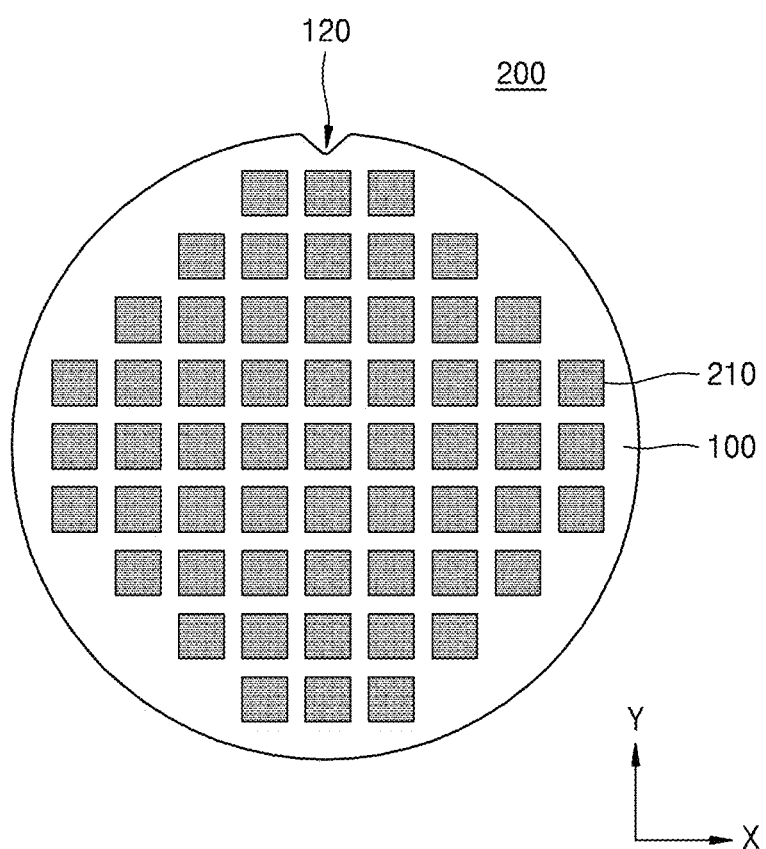
FIG. 1 is a plan view of a semiconductor structure including a semiconductor wafer according to an example embodiment.

FIG. 1 is a plan view of a semiconductor structure 200 including a semiconductor wafer 100 according to an example embodiment.

In FIG. 1, an X direction and a Y direction may be directions horizontal to the surface of a semiconductor wafer 100. The semiconductor structure 200 may include the semiconductor wafer 100, a notch portion 120 formed at an edge of the semiconductor wafer 100, and a plurality of semiconductor chips 210 formed on one surface of the semiconductor wafer 100.

The semiconductor wafer 100 may be a silicon wafer. The semiconductor wafer 100 may be a wafer including a semiconductor element such as germanium (Ge), or a compound semiconductor such as silicon carbide (SiC), gallium arsenide (GaAs), indium arsenide (InAs), and indium phosphide (InP). The semiconductor wafer 100 may be a wafer including a silicon-on-insulator. The semiconductor wafer 100 may be a p-type wafer including p-type impurity ions, or an n-type wafer including n-type impurity ions. The notch portion 120 may be provided to align a crystal orientation of the semiconductor wafer 100 or the semiconductor wafer 100 during a manufacturing process.

The semiconductor chips 210 may be arranged across the entire surface of the semiconductor wafer 100, except an outer circumferential portion of the semiconductor wafer 100. Each of the semiconductor chips 210 may include an integrated circuit therein. For example, an integrated circuit may include a memory circuit or a logic circuit.

Furthermore, the semiconductor chips 210 may include various kinds of individual devices. An individual device may include various electronic devices, for example, metal-oxide-semiconductor field-effect transistor (MOSFET) such as a complementary metal-oxide-semiconductor (CMOS) transistor, a system large scale integration (LSI), an image sensor such as a CMOS imaging sensor (CIS), a micro-electro-mechanical system (MEMS), an active device, a passive device, etc.

A production unit cost of the semiconductor chips 210 may be reduced by arranging a larger number of the semiconductor chips 210 on the semiconductor wafer 100. Also, when manufacturing yield of the semiconductor chips 210 arranged adjacent to the outer circumferential portion of the semiconductor wafer 100 is increased, the production unit cost of the semiconductor chips 210 may be reduced.

The manufacturing yield of the semiconductor chips 210 arranged adjacent to the outer circumferential portion of the semiconductor wafer 100 may be affected by a bevel portion (inclined portion or edge portion) located at an outer circumference (surroundings) of the semiconductor wafer 100. In other words, when a thin film or a photoresist film remains at the bevel portion (inclined portion or edge portion) located at the outer circumference (surroundings) of the semiconductor wafer 100 and acts as a defect, the manufacturing yield may be reduced.

Accordingly, the shape or size of the bevel portion located at the outer circumference (surroundings) of the semiconductor wafer 100 needs to be optimized. In the following description, the shape or size of the bevel portion of the semiconductor wafer 100 is described in detail.

Figure 2:
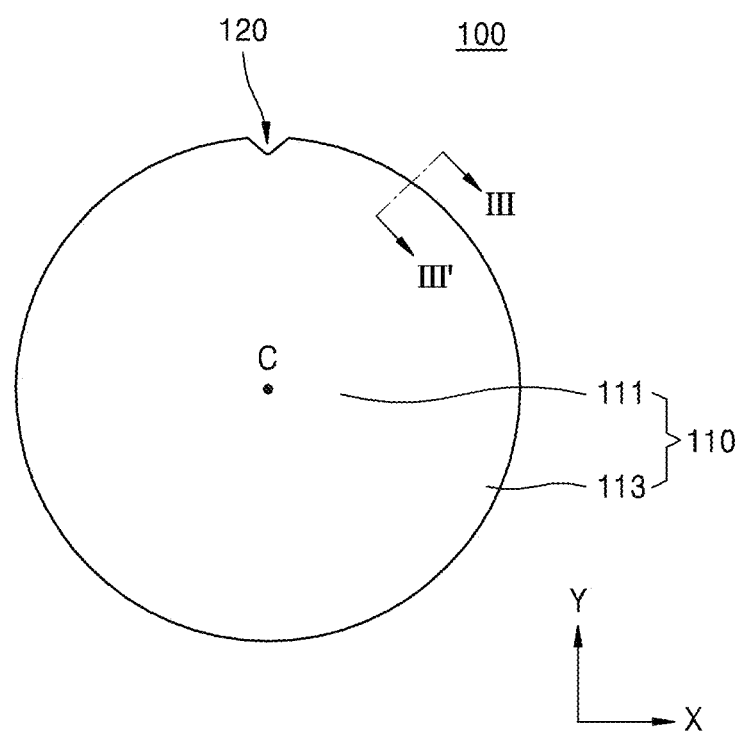
FIG. 2 is a plan view of the semiconductor wafer of FIG. 1.
Figure 3:
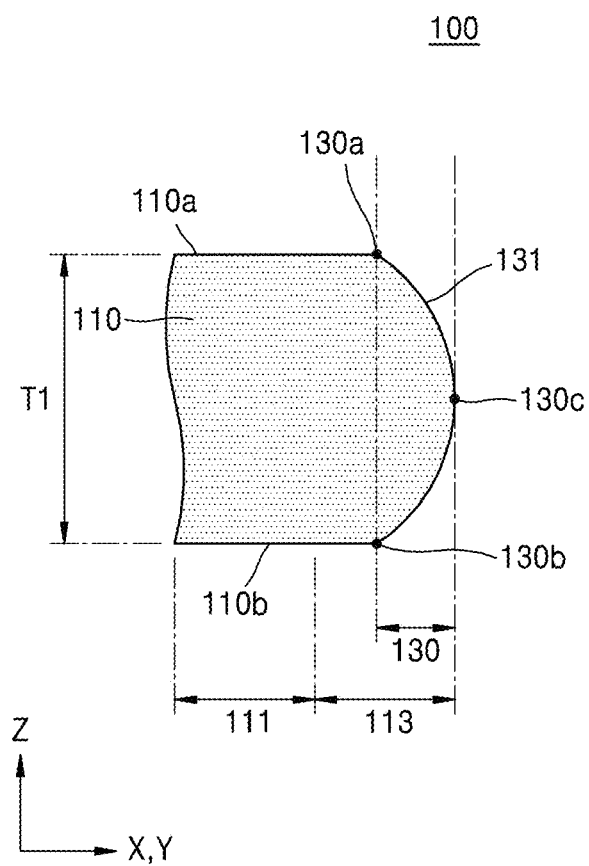
FIG. 3 is a cross-sectional view of the semiconductor wafer taken along a line III-III' of FIG. 2.
Figure 4:
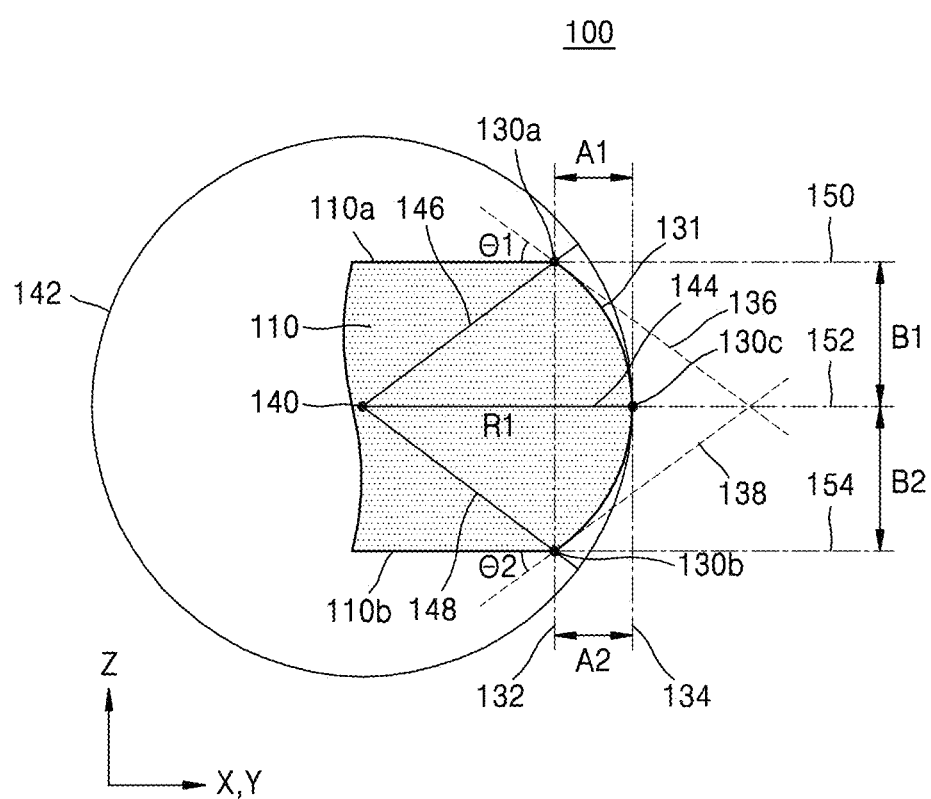
FIG. 4 is a detailed view of a structure of the semiconductor wafer of FIG. 3.

FIG. 2 is a plan view of the semiconductor wafer 100 of FIG. 1. FIG. 3 is a cross-sectional view of the semiconductor wafer 100 taken along a line III-III' of FIG. 2. FIG. 4 is a detailed view of a structure of the semiconductor wafer 100 of FIG. 3.

In detail, in FIGS. 2 to 4, the X direction and the Y direction may be directions horizontal to the surface of the semiconductor wafer 100. In FIGS. 2 to 4, a Z direction may be a direction perpendicular to the surface of the semiconductor wafer 100.

The semiconductor wafer 100 may include a wafer body 110, the notch portion 120, and a bevel portion 130. The wafer body 110 includes a center C, and corresponds to the overall shape of the semiconductor wafer 100. The wafer body 110 may include a chip forming area 111 in which a passive device, an active device, or an integrated circuit are formed, and an edge area 113 that encompasses the chip forming area 111.

The bevel portion 130 may be formed in the edge area 113 of the wafer body 110 along the outer circumference (surroundings) of the wafer body 110. Although in FIG. 3 the bevel portion 130 is included in the edge area 113, all of the edge area 113 may be the bevel portion 130.

Edge machining (bevel machining) or edge etching (bevel etching) may be performed on the semiconductor wafer 100 to form the bevel portion 130. Because an edge of the semiconductor wafer 100 is rounded by the edge machining (bevel machining) or the edge etching (bevel etching), the semiconductor wafer 100 may be more durable than a semiconductor wafer with a sharp edge, and therefore less likely to be broken during the manufacturing process of the semiconductor wafer 100.

In addition, the chip forming area 111 may be increased as the area of the bevel portion 130 decreases. Generation of a defect in the bevel portion 130 may be reduced as a thin film or a photoresist film formed during a semiconductor manufacturing process remains on the bevel portion 130. Accordingly, optimization of the shape or size of the bevel portion 130 is needed during edge machining (bevel machining) or edge etching (bevel etching) of the semiconductor wafer 100.

The structure of the semiconductor wafer 100 is described below in detail. The wafer body 110 may have a first surface 110a and a second surface 110b, which are opposite to each other. The first surface 110a and the second surface 110b may be substantially parallel to each other. The wafer body 110 may have a certain thickness T1, that is, a distance between the first surface 110a and the second surface 110b of the wafer body 110. The thickness T1 of the wafer body 110 may be about 755 μm to about 795 μm. The semiconductor wafer 100 may have a diameter of about 300 mm.

The notch portion 120 may be used to align a crystal orientation of the semiconductor wafer 100. The notch portion 120 may be arranged in the edge area 113 of the wafer body 110. The notch portion 120 may have a notch formed to a certain depth in a direction toward a center portion of the wafer body 110 from the outer circumference (surroundings) of the wafer body 110.

The notch portion 120 may be provided in the semiconductor wafer 100 to align the semiconductor wafer 100 during the semiconductor manufacturing process. For example, the semiconductor wafer 100 may be aligned by placing the semiconductor wafer 100 on a rotatable support device, and detecting the notch portion by using a detection sensor, such as a laser sensor, while rotating the semiconductor wafer 100. As illustrated in FIG. 2, the notch portion 120 may have various shapes, for example, a "U" or "V" shaped end portion, when viewed from a direction perpendicular to the first surface 110a of the wafer body 110.

The bevel portion 130 may be formed in the edge area 113 of the wafer body 110 along the outer circumference (surroundings) of the wafer body 110. The bevel portion 130 may include an inclined surface 131 connecting the first surface 110a and the second surface 110b of the wafer body 110. The inclined surface 131 may have a convex shape. The bevel portion 130 may include an edge profile of the semiconductor wafer 100.

The bevel portion 130 may include a first point 130a where the first surface 110a meets the inclined surface 131, a second point 130b where the second surface 110b meets the inclined surface 131, and a third point 130c located at the outermost side of the inclined surface 131.

The first point 130a and the second point 130b may be points from which the thickness of the semiconductor wafer 100 begins to decrease. The bevel portion 130 may have a first bevel length A1 between an end portion of the first surface 110a, that is, the first point 130a, and an end portion of the inclined surface 131 adjacent thereto, that is, the third point 130c. The first bevel length A1 may be a horizontal straight distance from the first point 130a where the inclined surface 131 meets the first surface 110a to the outermost point of the inclined surface 131, that is, the third point 130c. The first bevel length A1 may be determined by flatness of the first surface 110a. In an example embodiment, the first bevel length A1 may be about 200 um to about 295 um.

The bevel portion 130 may have a second bevel length A2 between an end portion of the second surface 110b, that is, the second point 130b, and an end portion, that is, the third point 130c of the inclined surface 131 adjacent thereto. The second bevel length A2 may be a horizontal straight distance from the second point 130b where the inclined surface 131 meets the second surface 110b to the outermost point of the inclined surface 131, that is, the third point 130c. The second bevel length A2 may be determined by flatness of the second surface 110b. In an example embodiment, the second bevel length A2 may have the same value as the first bevel length A1. In other words, the second bevel length A2 may be about 200 μm to about 295 μm.

In another viewpoint, with respect to a first virtual straight line 132 extending from the first point 130a where the first surface 110a meets the inclined surface 131 to the second point 130b where the second surface 110b meets the inclined surface 131, the bevel portion 130 may have the first and second bevel lengths A1 and A2 in a radius direction of the semiconductor wafer 100.

In other words, the first and second bevel lengths A1 and A2 may be straight lengths from the first virtual straight line 132 to a second virtual straight line 134 contacting the third point 130c and tangentially arranged relative to the bevel portion 130.

The bevel portion 130 may have a third bevel length B1 that is a vertical distance from the first point 130a to the third point 130c. The third bevel length B1 may be a vertical distance from a sixth virtual straight line 150 extending from the first point 130a and a seventh virtual straight line 152 extending from the third point 130c.

The bevel portion 130 may have a fourth bevel length B2 that is a vertical distance from the second point 130b to the third point 130c. The fourth bevel length B2 may be a vertical distance between an eighth virtual straight line 154 extending from the second point 130b and the seventh virtual straight line 152 extending from the third point 130c. The third bevel length B1 and the fourth bevel length B2 may be the same value.

The bevel portion 130 may have a first bevel angle θ1 between a tangential direction of the inclined surface 131 and the first surface 110a. In detail, the bevel portion 130 may have the first bevel angle θ1 between the first surface 110a and a first tangent line 136 contacting the first point 130a.

The first bevel angle θ1 may be determined based on a capillary force of a fluid (or liquid) that may be coated on the first surface 110a and a radius R1 of a virtual circumcircle 142 circumscribing the outermost point of the inclined surface 131, as described below. In an example embodiment, the first bevel angle θ1 may be 30° to 42°.

The bevel portion 130 may have a second bevel angle θ2 between the tangential direction of the inclined surface 131 and the second surface 110b. In detail, the bevel portion 130 may have the second bevel angle θ2 between the second surface 110b and a second tangent line 138 contacting the second point 130b in a direction from the inclined surface 131 toward the second point 130b. In an example embodiment, the second bevel angle θ2 may be the same as the first bevel angle θ1. In other words, the second bevel angle θ2 may be 30° to 42°.

As illustrated in FIG. 3, a boundary between the chip forming area 111 and the edge area 113 of the semiconductor wafer 100 may be spaced apart from the first point 130a or the second point 130b where the inclined surface 131 begins. However, example embodiments are not limited thereto, and the boundary between the chip forming area 111 and the edge area 113 may be almost matched with the first point 130a or the second point 130b.

The third point 130c may be a point where the semiconductor wafer 100 has a point contact (or line contact) with an external contact member. Because the semiconductor wafer 100 is beveled, a contact area with the external contact member is reduced. The external contact member may be an electrostatic chuck or a stage of a semiconductor manufacturing device. Because FIGS. 3 and 4 are cross-sectional views, the third point 130c may be indicated as a point. The third point 130c may contact the virtual circumcircle 142 as illustrated in FIG. 4.

A center point 140 of the virtual circumcircle 142 may be located in the wafer body 110. The virtual circumcircle 142 may have the radius R1 that is a length of a third virtual straight line 144 from the center point 140 to the outermost point of the inclined surface 131, that is, the third point 130c. The length of a fourth virtual straight line 146 from the center point 140 via first point 130a and contacting the virtual circumcircle 142 may have a radius less than radius R1. The length of the fifth virtual straight line 148 from the center point 140 via second point 130b and contacting the virtual circumcircle 142 may also have a radius less than radius R1. In an example embodiment, the radius R1 of the virtual circumcircle 142 may be about 465 μm to about 930 μm.

In an example embodiment, the inclined surface 131 may be located within the virtual circumcircle 142 in an upper side and a lower side of the third virtual straight line 144. In an example embodiment, points on the inclined surface 131 may have a decreasing curvature from the third point 130c to the first point 130a. The semiconductor wafer 100 configured as above may have various effects by optimizing the shape or size of the bevel portion 130.

In the semiconductor wafer 100, as the bevel lengths A1 and A2 of the bevel portion 130 decrease, flatness of the first surface 110a and the second surface 110b of the wafer body 110 may increase. In the semiconductor wafer 100, because the outermost point of the bevel portion 130 has a point contact (or line contact) with the external contact member, thereby reducing a contact area, the semiconductor wafer 100 may be prevented from being broken during the semiconductor manufacturing process.

In other words, the semiconductor wafer 100 has the virtual circumcircle 142 that circumscribes the outermost point of the bevel portion 130, and thus the bevel portion 130 has a point contact with the external contact member, thereby reducing the contact area. Accordingly, the semiconductor wafer 100 may reduce damage of the semiconductor wafer 100 by reducing the contact area between the bevel portion 130 and the external contact member during the semiconductor manufacturing process.

In the semiconductor wafer 100, the bevel angles θ1 and θ2 of the bevel portion 130 are optimized such that, a capillary force of a fluid (or liquid), for example, a photoresist film, on the inclined surface 131 is reduced while minimizing the bevel lengths A1 and A2. Accordingly, generation of a defect due to the fluid (or liquid) remaining on the inclined surface 131 may be reduced.

Figure 5:
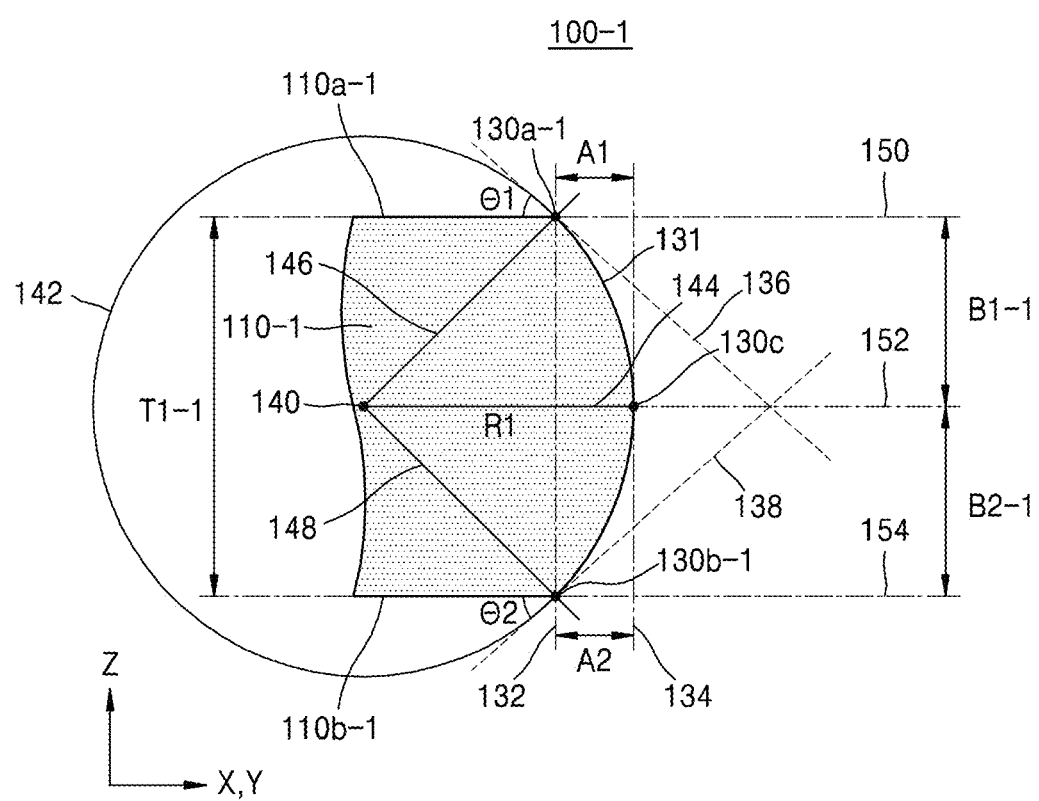
FIG. 5 is a detailed view of a structure of a semiconductor wafer according to an example embodiment.

FIG. 5 is a detailed view of a structure of a semiconductor wafer 100-1 according to an example embodiment.

In detail, when compared with FIG. 4, FIG. 5 illustrates a thicker wafer body 110-1. In FIGS. 4 and 5, like reference numerals denote like elements. The same features as those of FIG. 4 are briefly described or omitted in FIG. 5.

A thickness T1-1 of the wafer body 110-1 of the semiconductor wafer 100-1 of FIG. 5 is greater than the thickness T1 of the wafer body 110 of the semiconductor wafer 100 of FIG. 4. For example, the thickness T1-1 of the wafer body 110-1 of a semiconductor wafer 100-1 of FIG. 5 may range from about 755 μm to about 795 μm.

The semiconductor wafer 100-1 may include a first point 130a-1 where a first surface 110a-1 meets the inclined surface 131, a second point 130b-1 where the second surface 110b meets the inclined surface 131, and the third point 130c located at the outermost side of the inclined surface 131.

The third point 130c may contact the virtual circumcircle 142. The virtual circumcircle 142 may have the radius R1 that is the length of the third virtual straight line 144 from the center point 140 to the outermost point of the inclined surface 131, that is, the third point 130c. In the semiconductor wafer 100-1, the length of the fourth virtual straight line 146 from the center point 140 to the first point 130a-1 meeting the virtual circumcircle 142 may be the radius R1 of the virtual circumcircle 142. In the semiconductor wafer 100-1, the length of the fifth virtual straight line 148 from the center point 140 to the second point 130b-1 may also be the radius R1 of the virtual circumcircle 142.

In other words, the first point 130a-1 and the second point 130b-1 may be located on the virtual circumcircle 142. Accordingly, points on the inclined surface 131 may have the same curvature from the third point 130c to the first point 130a-1. Also, points on the inclined surface 131 may have the same curvature from the third point 130c to the second point 130b-1. The radius R1 of the virtual circumcircle 142 may be the same as that described in FIG. 4.

The first and second bevel lengths A1 and A2 and the first and second bevel angles θ1 and θ2 of the semiconductor wafer 100-1 may be the same as those described in FIG. 4. Because the thickness of the wafer body 110-1 of the semiconductor wafer 100-1 is illustrated to be greater than that of the wafer body 110 of the semiconductor wafer 100, the third and fourth bevel lengths B1-1 and B2-1 of the semiconductor wafer 100-1 may be greater than the third and fourth bevel lengths B1 and B2 of the semiconductor wafer 100, respectively.

Figure 6A:
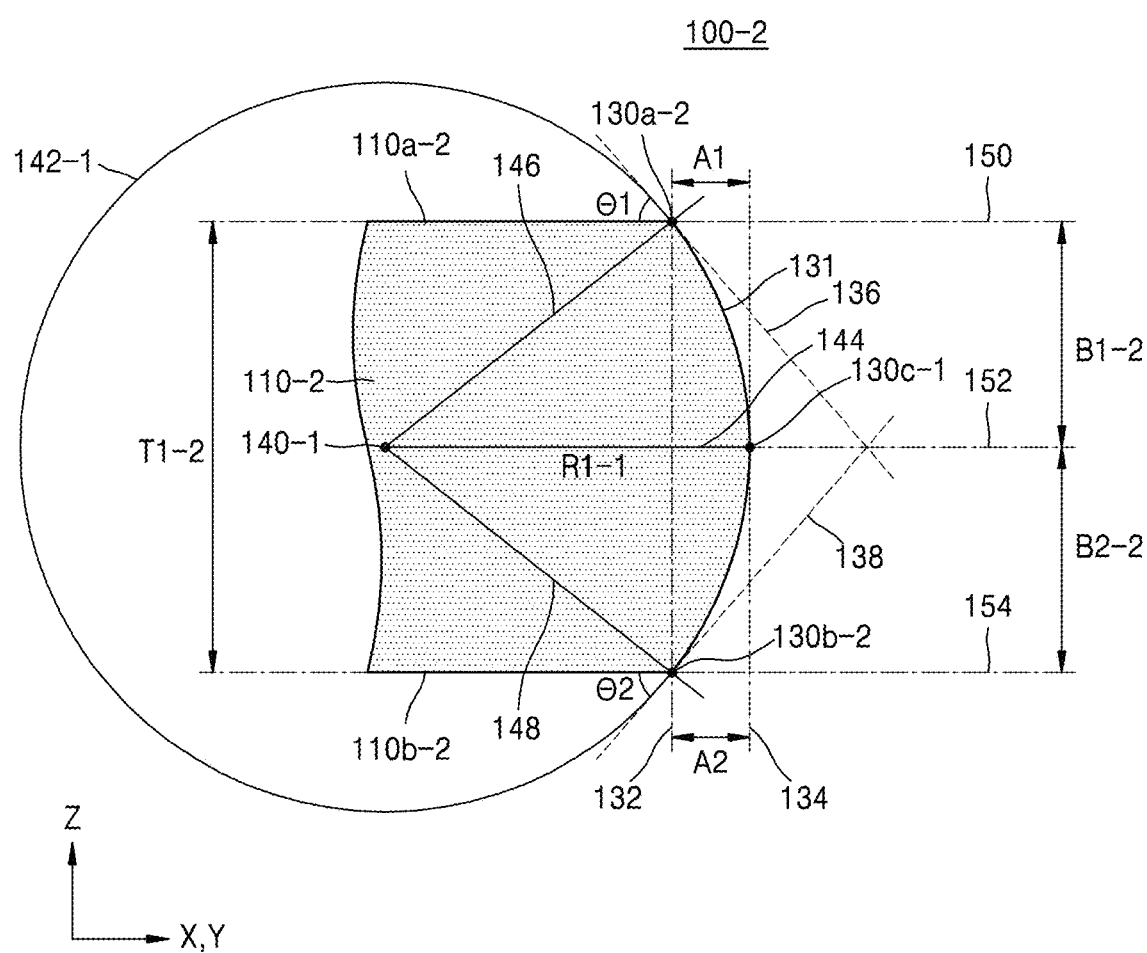
FIGS. 6A and 6B are detailed views of structures of semiconductor wafers according to example embodiments.
Figure 6B:
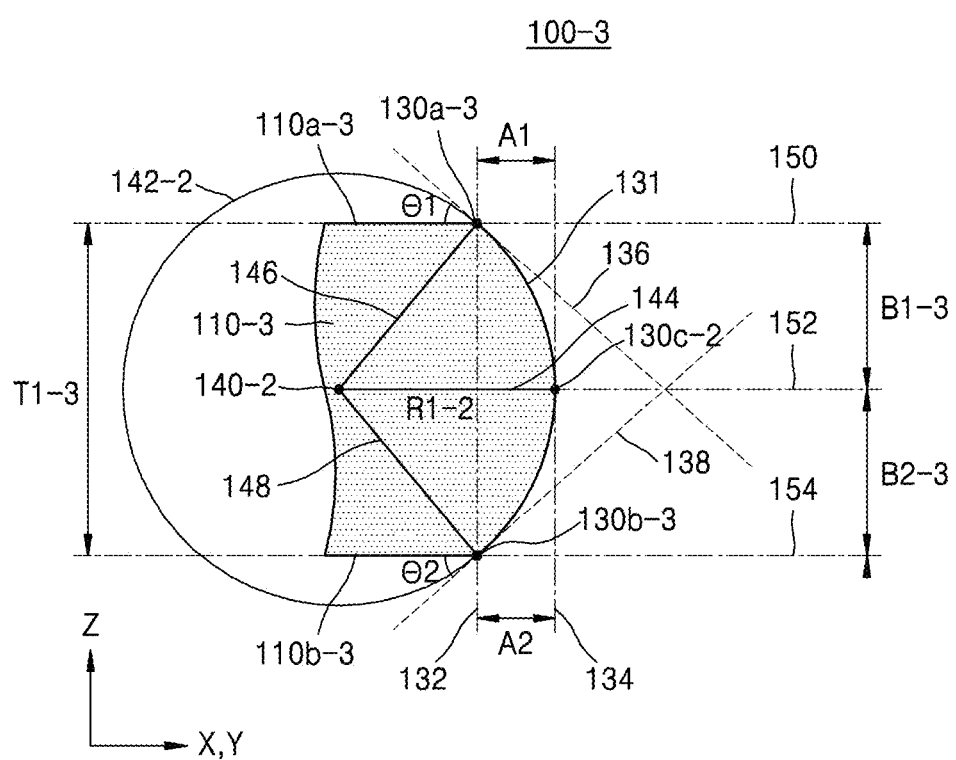

FIGS. 6A and 6B are detailed views of structures of semiconductor wafers 100-2 and 100-3 according to example embodiments.

In detail, FIGS. 6A and 6B illustrate a change in the amount of radii R1-1 and R1-2 of virtual circumcircles 142-1 and 142-2 according to thicknesses of wafer bodies 110-2 and 110-3. In FIGS. 6A and 6B, the same reference numerals as those of FIGS. 4 and 5 denote the same elements. In FIGS. 6A and 6B, the same features as those of FIGS. 4 and 5 are briefly described or omitted.

As illustrated in FIG. 6A, thickness T1-2 of the wafer body 110-2 of the semiconductor wafer 100-2 is greater than the thickness T1-1 of the semiconductor wafer 100-1 of the wafer body 110-1 of FIG. 5. As illustrated in FIG. 6B, thickness T1-3 of the wafer body 110-3 of the semiconductor wafer 100-3 is smaller than the thickness T1-1 of the semiconductor wafer 100-1 of the wafer body 110-1 of FIG. 5. The thicknesses T1-2 and T1-3 of the wafer bodies 110-2 and 110-3 of FIGS. 6A and 6B may be outside a range of the thicknesses T1 and T1-1 of the wafer bodies 110 and 110-1 of FIGS. 4 and 5, that is, less than 755 μm or greater than 795 μm.

The semiconductor wafers 100-2 and 100-3 of FIGS. 6A and 6B may respectively include first points 130a-2 and 130a-3 where first surfaces 110a-2 and 110a-3 meet the inclined surface 131, second points 130b-2 and 130b-3 where second surfaces 110b-2 and 110b-3 meet the inclined surface 131, and third points 130c-1 and 130c-2 located at the outermost side of the inclined surface 131.

The third points 130c-1 and 130c-2 may contact the virtual circumcircles 142-1 and 142-2, respectively. The virtual circumcircles 142-1 and 142-2 may respectively have radii R1-1 and R1-2 that are the length of the third virtual straight line 144 from center points 140-1 and 140-2 to the outermost point of the inclined surface 131. In the semiconductor wafers 100-2 and 100-3, the length of the fourth virtual straight line 146 from each of the center points 140-1 and 140-2 to each of the first points 130a-2 and 130a-3 respectively meeting the virtual circumcircles 142-1 and 142-2 may be the radii R1-1 and R1-2 of the virtual circumcircles 142-1 and 142-2.

In the semiconductor wafers 100-2 and 100-3, the length of the fifth virtual straight line 148 from the center points 140-1 and 140-2 to the second points 130b-2 and 130b-3 may be the radii R1-1 and R1-2 of the virtual circumcircles 142-1 and 142-2, respectively. When the thicknesses of the wafer bodies 110-2 and 110-3 of the semiconductor wafers 100-2 and 100-3 are outside of a range from about 755 μm to about 795 μm, the radii R1-1 and R1-2 of the virtual circumcircles 142-1 and 142-2 may have a range in micrometers according to Mathematical Expression 1.

$$(0.62)T+0.4 < R < (1.2)T-26$$  [Mathematical Expression 1]

As illustrated in FIGS. 4 and 5, first and second bevel lengths A1 and A2 of the semiconductor wafers 100-2 and 100-3, and the first and second bevel angles θ1 and θ2 of the semiconductor wafers 100-2 and 100-3 are also the same. The thickness T1-2 of the wafer body 110-2 of the semiconductor wafer 100-2 may be greater than the thickness T1-1 of the wafer body 110-1 of the semiconductor wafer 100-1. Accordingly, third and fourth bevel lengths B1-2 and B2-2 of the semiconductor wafer 100-2 may be greater than the third and fourth bevel lengths B1-1 and B2-1 of the semiconductor wafer 100-1.

The thickness T1-3 of the wafer body 110-3 of the semiconductor wafer 100-3 may be smaller than the thickness T1-1 of the wafer body 110-1 of the semiconductor wafer 100-1. Accordingly, third and fourth bevel lengths B1-3 and B2-3 of the semiconductor wafer 100-3 may be smaller than the third and fourth bevel lengths B1-1 and B2-1 of the semiconductor wafer 100-1.

Figure 7:
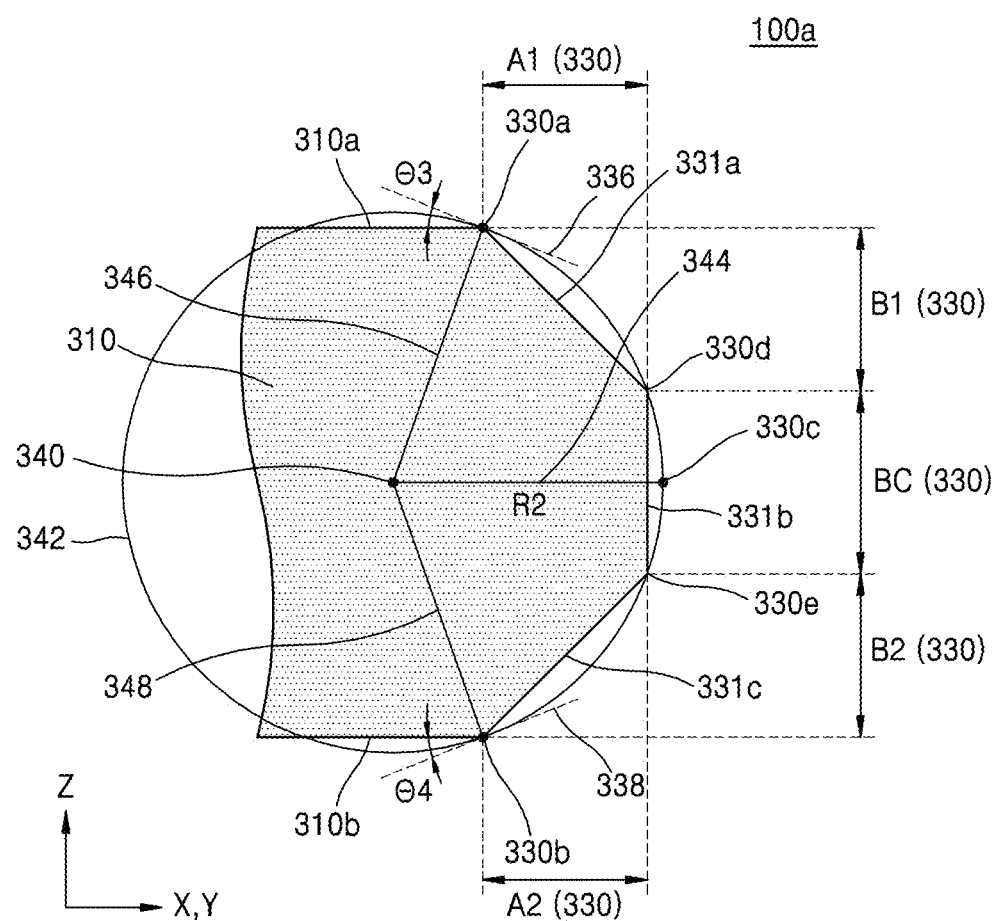
FIG. 7 is a cross-sectional view for explaining a point contact (or a line contact) of a semiconductor wafer according to an example embodiment.

FIG. 7 is a cross-sectional view for explaining a point contact (or a line contact) of a reference semiconductor wafer 100a according to an example embodiment.

Figure 8:
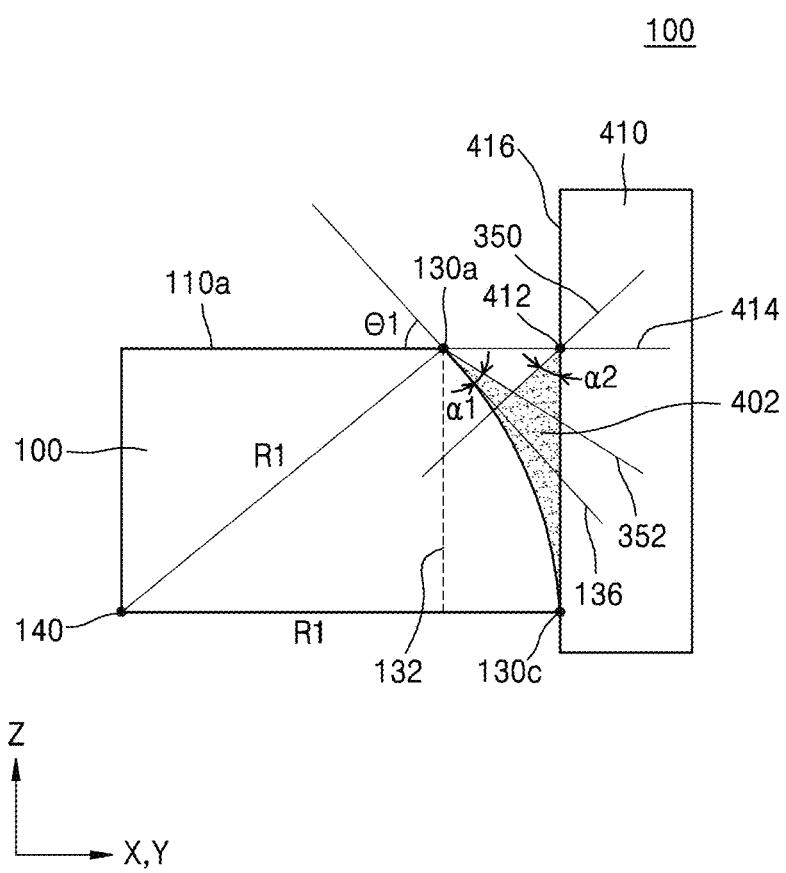
FIG. 8 is a cross-sectional view for explaining a bevel angle and a capillary force of the bevel portion of a semiconductor wafer according to example embodiments.

In detail, FIG. 7 is a view for explaining that the semiconductor wafer 100 of FIGS. 2 to 4 has a point contact (or line contact), not a surface contact, configured to contact an external contact member 410 (see FIG. 8). For convenience of explanation, referring to FIG. 7, the reference semiconductor wafer 100a has a point contact (or line contact) with the external contact member 410 of FIG. 8.

In FIG. 7, the X direction and the Y direction may be directions parallel to the surface of the semiconductor wafer 100 of FIGS. 2 to 4, and a Z direction may be a direction perpendicular to the surface of the semiconductor wafer 100 of FIGS. 2 to 4. The size of a bevel portion 330 of the reference semiconductor wafer 100a may be defined with reference to FIG. 7.

As illustrated in FIG. 7, a reference wafer body 310 of the reference semiconductor wafer 100a may have a first surface 310a, a second surface 310b, a first inclined surface 331a, a vertical surface 331b and a second inclined surface 331c. The first surface 310a may be a front or upper surface, and the second surface 310b may be a rear or lower surface. The bevel portion 330 of the reference semiconductor wafer 100a may include the first inclined surface 331a, the vertical surface 331b, and the second inclined surface 331c.

The first inclined surface 331a may be a surface connecting an end portion of the first surface 310a, that is a first point 330a, and an outermost portion of the reference wafer body 310, that is a fourth point 330d. A first tangent line 336 contacts an end portion of the first surface 310a, that is, the first point 330a. A third bevel angle θ3 may be formed between the first tangent line 336 and the first surface 310a. Because the third bevel angle θ3 is an angle of a tangent line of the end portion of the first surface 310a, the third bevel angle θ3 may correspond to the first bevel angle θ1 of FIG. 4.

The second inclined surface 331c may be a surface connecting an end portion of the second surface 310b, that is a second point 330b, and an outermost portion of the reference wafer body 310, that is a fifth point 330e. A second tangent line 338 contacts an end portion of the second surface 310b, that is, the second point 330b. A fourth bevel angle θ4 may be formed between the second tangent line 338 and the second surface 310b.

Because the fourth bevel angle θ4 is an angle of a tangent line of the end portion of the second surface 310b, the fourth bevel angle θ4 may correspond to the second bevel angle θ2 of FIG. 4. As such, the bevel portion 330 of the reference semiconductor wafer 100a may have the third bevel angle θ3 and the fourth bevel angle θ4.

The vertical surface 331b may be a surface connecting the first inclined surface 331a and the second inclined surface 331c in a vertical direction. The vertical surface 331b may include the fourth point 330d where the vertical surface 331b meets the first inclined surface 331a and the fifth point 330e where the second inclined surface 331c meets the second inclined surface 331c. The bevel portion 330 may include a virtual circumcircle 342 circumscribing at least one of the first point 330a, the second point 330b, the fourth point 330d, and the fifth point 330e. The virtual circumcircle 342 may correspond to the virtual circumcircle 142 of FIG. 4.

For example, a radius R2 of the virtual circumcircle 342 may be a length of a virtual straight line 346 from a center point 340 to the first point 330a. The radius R2 of the virtual circumcircle 342 may be a length of a virtual straight line 348 from the center point 340 to the second point 330b. In addition, the radius R2 of the virtual circumcircle 342 may be a length of a virtual straight line 344 from the center point 340 to a third point 330c located outside the reference wafer body 310. Although, in FIG. 7 the third point 330c is illustrated to be located outside the reference wafer body 310, the reference wafer body 310 may extend to the third point 330c, which may therefore be the outermost point of the reference wafer body 310.

The bevel portion 330 of the reference semiconductor wafer 100a may have the first bevel length A1, the second bevel length A2, the third bevel length B1, the fourth bevel length B2, and a fifth bevel length BC. The first bevel length A1 may be a horizontal distance between the first point 330a and the fourth point 330d. The second bevel length A2 may be a horizontal distance between the second point 330b and the fifth point 330e. The first bevel length A1 and the second bevel length A2 of FIG. 7 may correspond to the first bevel length A1 and the second bevel length A2 of FIG. 4.

The third bevel length B1 may be a vertical distance between the first point 330a and the fourth point 330d. The fourth bevel length B2 may be a vertical distance between the second point 330b and the fifth point 330e. The fifth bevel length BC may be a vertical distance between the fourth point 330d and the fifth point 330e.

When the fifth bevel length BC is 0, the reference semiconductor wafer 100a may have a point contact (or line contact), not a surface contact, with the external contact member 410 as shown in FIG. 8. The third bevel angle θ3 in the first point 330a to make the fifth bevel length BC zero (0) may be 42° or less. When the fifth bevel length BC is 0, the fourth bevel angle θ4 in the second point 330b may be 42° or less.

Referring back to FIG. 4, a point contact (or line contact) of the semiconductor wafer 100 is described. As described above, the virtual circumcircle 142 of FIG. 4 may correspond to the virtual circumcircle 342 of FIG. 7.

The third point 130c of FIGS. 3 and 4 may correspond to the third point 330c of FIG. 7. When the semiconductor wafer 100 of FIGS. 3 and 4 and the reference semiconductor wafer 100a of FIG. 7 are compared to each other, the fifth bevel length BC of the semiconductor wafer 100 of FIGS. 3 and 4 may be 0. In addition, the first bevel angle θ1 at the first point 130a to make the fifth bevel length BC zero (0) may be 42° or less. The second bevel angle θ2 at the second point 130b to make the fifth bevel length BC zero (0) may be 42° or less.

Accordingly, as the semiconductor wafer 100 has a point contact (or line contact) with the external contact member during the semiconductor manufacturing process, a contact area with the external contact member 410 is reduced, and thus damage to the semiconductor wafer 100 may be reduced. In addition, as described above, in the semiconductor wafer 100, the first and second bevel angles θ1 and θ2 of the bevel portion 130 are 42° or less, and thus, a capillary force of a fluid (or liquid), for example, a photoresist film, on the inclined surface 131 is reduced while reducing the bevel lengths A1 and A2. Accordingly, generation of a defect as the fluid (or liquid) remains on the inclined surface 131 may be reduced.

FIG. 8 is a cross-sectional view for explaining a bevel angle and a capillary force of the bevel portion 130 of the semiconductor wafer 100.

In detail, in FIG. 8, the X direction and the Y direction may be directions that are horizontal to the surface of the semiconductor wafer 100 of FIGS. 2 to 4. The Z direction may be a direction perpendicular to the surface of the semiconductor wafer 100 of FIGS. 2 to 4.

In FIG. 8, a bevel angle, that is, the first bevel angle θ1, of the first surface 110a and a capillary force of a fluid (or liquid) 402 are illustrated when the fluid (or liquid) 402, for example, a photoresist film, is coated on the semiconductor wafer 100. In FIG. 8, the same reference numerals as those of FIG. 4 denote the same elements. In FIG. 8, for convenience of explanation, the radii from the center point 140 to the first point 130a and the third point 130c are illustrated to be the same.

When the fluid (or liquid) 402, for example, a photoresist film, is coated on the semiconductor wafer 100, a capillary force Fcap may be calculated based on the first bevel angle θ1. The capillary force Fcap of the fluid (or liquid) 402 may be determined based on a surface tension Fst and Laplace pressure Fp of the fluid (or liquid) 402 coated on the inclined surface 131, as expressed in Mathematical Expression 2.

$$F_{cap} = F_{st} + F_p \approx 4\pi R1\gamma(\cos(\alpha 1) + \cos(\alpha 2))$$ [Mathematical Expression 2]

In Mathematical Expression 2, "R1" may be a distance between the center point 140 of the virtual circumcircle 142 of FIG. 4 and the first point 130a or the third point 130c. "γ" may be a surface tension of the fluid (or liquid) 402. "α1" may be a contact angle of the fluid (or liquid) 402 contacting the inclined surface 131 at the first point 130a. In other words, the contact angle α1 may be a contact angle between a surface line 352 of the liquid 402 and the inclined surface 131, at the first point 130a.

"α2" may be a contact angle of the fluid (or liquid) 402 that contacts the external contact member 410 at a contact point 412 facing the first point 130a. The contact point 412 may be a point where a virtual extension line 414 extending from the first point 130a meets a surface of the external contact member 410. The contact angle α1 may be a contact angle between a surface line 350 and a contact surface 416 of the fluid (or liquid) 402, at the contact point 412.

Figure 9:
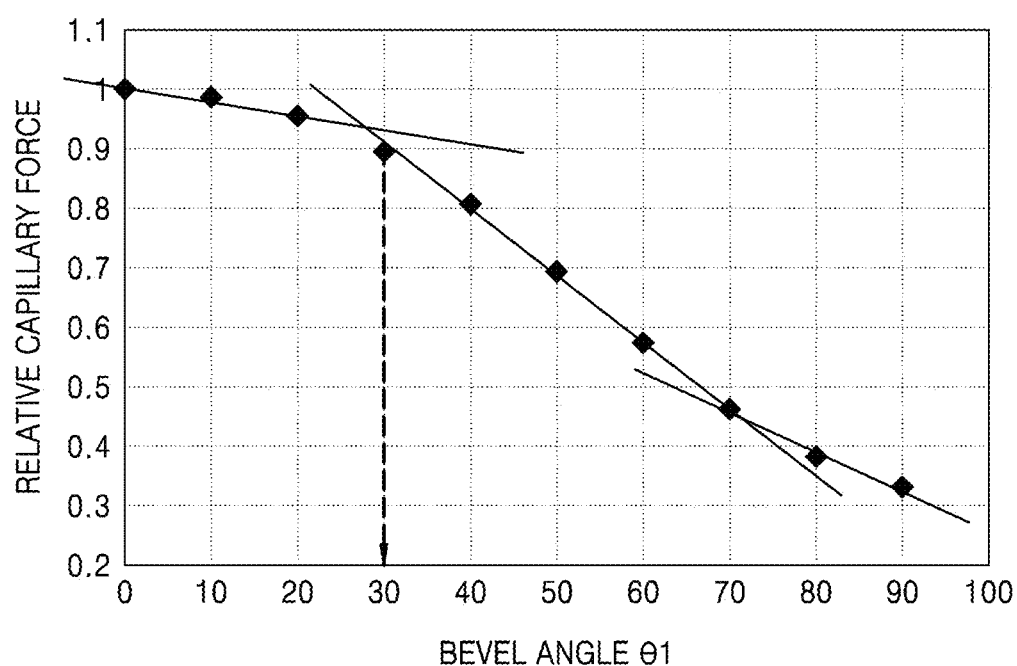
FIG. 9 is a graph for explaining the capillary force according to the bevel angle of a semiconductor wafer according to example embodiments.

FIG. 9 is a graph for explaining a capillary force according to a bevel angle of a semiconductor wafer.

In detail, an X axis indicates the first bevel angle θ1 of the semiconductor wafer 100 of FIGS. 4 and 8, and a Y axis indicates a relative capillary force of the semiconductor wafer 100 of FIGS. 4 and 8.

As illustrated in FIG. 9, it may be seen that, as the first bevel angle θ1 increases, the relative capillary force decreases. The capillary force of the semiconductor wafer 100 of FIGS. 4 and 8 may be set to be the first bevel angle θ1 of 30° that is an inflection point, that is, a rapid decline point. In addition, as described above in FIGS. 4 and 7, in order for the semiconductor wafer 100 to have a point contact (or line contact) with the external contact member 410, the first bevel angle θ1 may be set to be 42° or less.

In other words, the semiconductor wafer 100 of FIGS. 4 and 8 has a point contact (or line contact) with the external contact member 410 by optimizing the first and second bevel angles θ1 and θ2 of the bevel portion 130 to be 30° or more and 42° or less. Thus, the capillary force of the fluid (or liquid) 402 on the inclined surface 131 is reduced while minimizing the bevel lengths A1 and A2. Accordingly, generation of a defect as the fluid (or liquid) 402 remains on the inclined surface 131 may be reduced.

Figure 10:
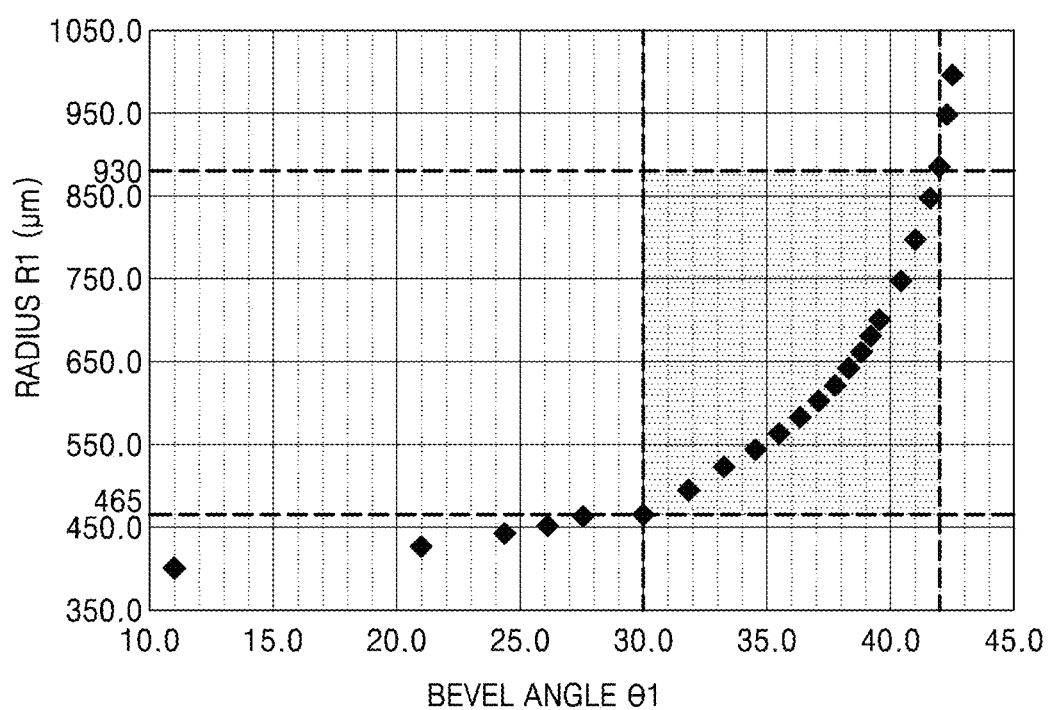
FIG. 10 is a graph for explaining a radius value of a virtual circumcircle according to a bevel angle of the semiconductor wafer according to example embodiments.

FIG. 10 is a graph for explaining a radius value of a virtual circumcircle according to a bevel angle of a semiconductor wafer.

In detail, the X axis indicates the first bevel angle θ1 of the semiconductor wafer 100 of FIGS. 4 and 8, and the Y axis indicates a radius value of the virtual circumcircle 142 of the semiconductor wafer 100 of FIGS. 4 and 8.

As illustrated in FIG. 10, it may be seen that, as the first bevel angle θ1 increases, the radius value of the virtual circumcircle 142 increases. Because in the semiconductor wafer 100 of FIGS. 4 and 8, the first bevel angle θ1 is set to be 30° or more and 42° or less, as described above, the radius value of the virtual circumcircle 142 may be set to be between approximately 465 μm and 930 μm.

As such, the semiconductor wafer 100 of FIGS. 4 and 8 has a point contact (or line contact) with the external contact member 410 by optimizing the radius value of the virtual circumcircle 142 to be between approximately 465 μm and 930 μm. Thus, the capillary force of the fluid (or liquid) 402 on the inclined surface 131 is reduced while the bevel lengths A1 and A2 are minimized. Accordingly, generation of a defect as the fluid (or liquid) remains on the inclined surface 131 may be reduced.

Figure 11:
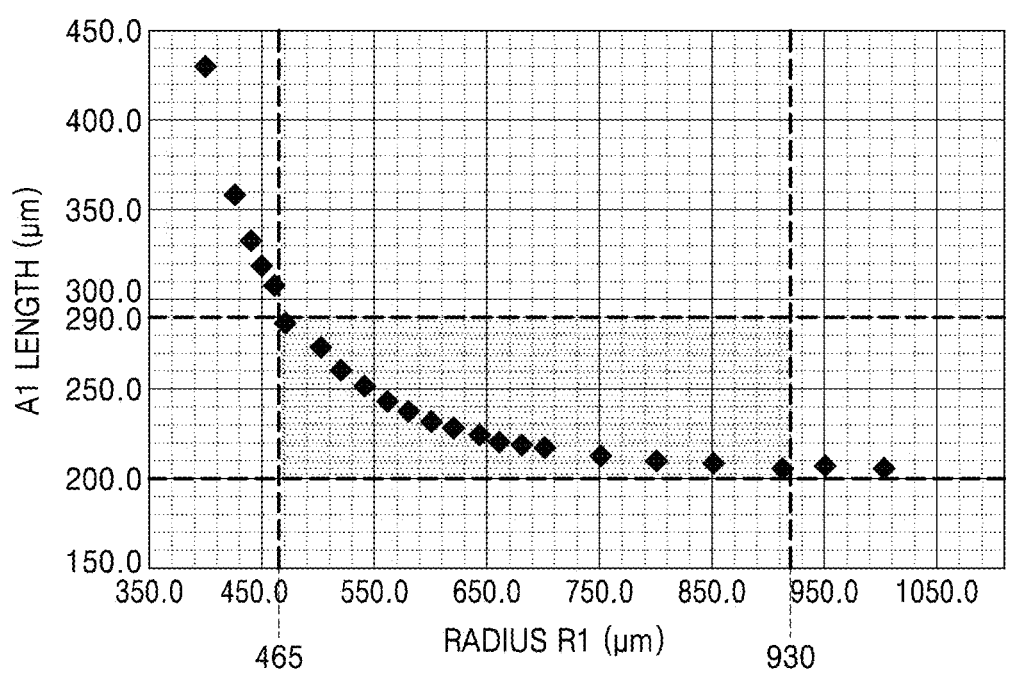
FIG. 11 is a graph showing a bevel length according to the radius value of the virtual circumcircle of a semiconductor wafer according to example embodiments.

FIG. 11 is a graph showing a bevel length according to a radius value of a virtual circumcircle of a semiconductor wafer.

In detail, the X axis indicates the radius value of the virtual circumcircle 142 of the semiconductor wafer 100 of FIGS. 4 and 8, and the Y axis indicates the first bevel length A1 of the semiconductor wafer 100 of FIGS. 4 and 8.

As illustrated in FIG. 11, it may be seen that, as a value of the radius R1 increases, the first bevel length A1 decreases. Because in the semiconductor wafer 100 of FIGS. 4 and 8, the value of the radius R1 is set to be between 465 μm and 930 μm, the first bevel length A1 may be set to be between 200 μm and 295 μm.

As such, the semiconductor wafer 100 of FIGS. 4 and 8 has a point contact (or line contact) with the external contact member 410 by optimizing the first bevel length A1 to be between 200 μm and 295 μm. Thus, the capillary force of the fluid (or liquid) 402 on the inclined surface 131 is reduced while minimizing the bevel lengths A1 and A2. Accordingly, generation of a defect as the fluid (or liquid) 402 remains on the inclined surface 131 may be reduced.

Figure 12:
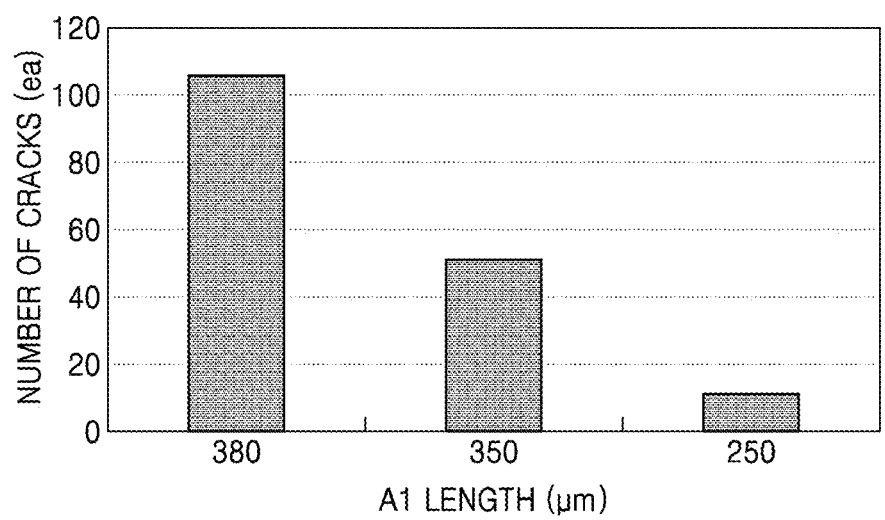
FIG. 12 is a graph showing the number of cracks generated according to the bevel length when a semiconductor manufacturing process is performed on the semiconductor wafer according to example embodiments.

FIG. 12 is a graph showing the number of cracks generated according to a bevel length when a semiconductor manufacturing process is performed on a semiconductor wafer.

In detail, the X axis indicates the first bevel length A1 of the semiconductor wafer 100 of FIG. 4, and the Y axis indicates the number of cracks generated according to the first bevel length A1 when a semiconductor manufacturing process is performed on the semiconductor wafer 100, for example, a semiconductor chip is manufactured.

As the first bevel length A1 increases, a load is concentrated on the bevel portion 130 (see FIG. 3) of the semiconductor wafer 100, and thus the number of cracks generated in the semiconductor wafer 100 may be increased. In other words, during the semiconductor manufacturing process, as the first bevel length A1 decreases, a load is lowered on the bevel portion 130 (see FIG. 3) of the semiconductor wafer 100, and thus the number of cracks generated in the semiconductor wafer 100 may be decreased.

For example, during the semiconductor manufacturing process, when the first bevel length A1 of the semiconductor wafer 100 is about 380 μm the number of generated cracks may be 100, whereas when the first bevel length A1 of the semiconductor water 100 is about 350 μm, the number of generated cracks may be 50. In contrast, during the semiconductor manufacturing process, when the first bevel length A1 of the semiconductor wafer 100 is about 250 μm, the number of generated cracks may be 10. As such, during the semiconductor manufacturing process, when the bevel length of the semiconductor wafer 100 is set to be about 250 μm, the number of generated cracks may be materially reduced.

Figure 13:
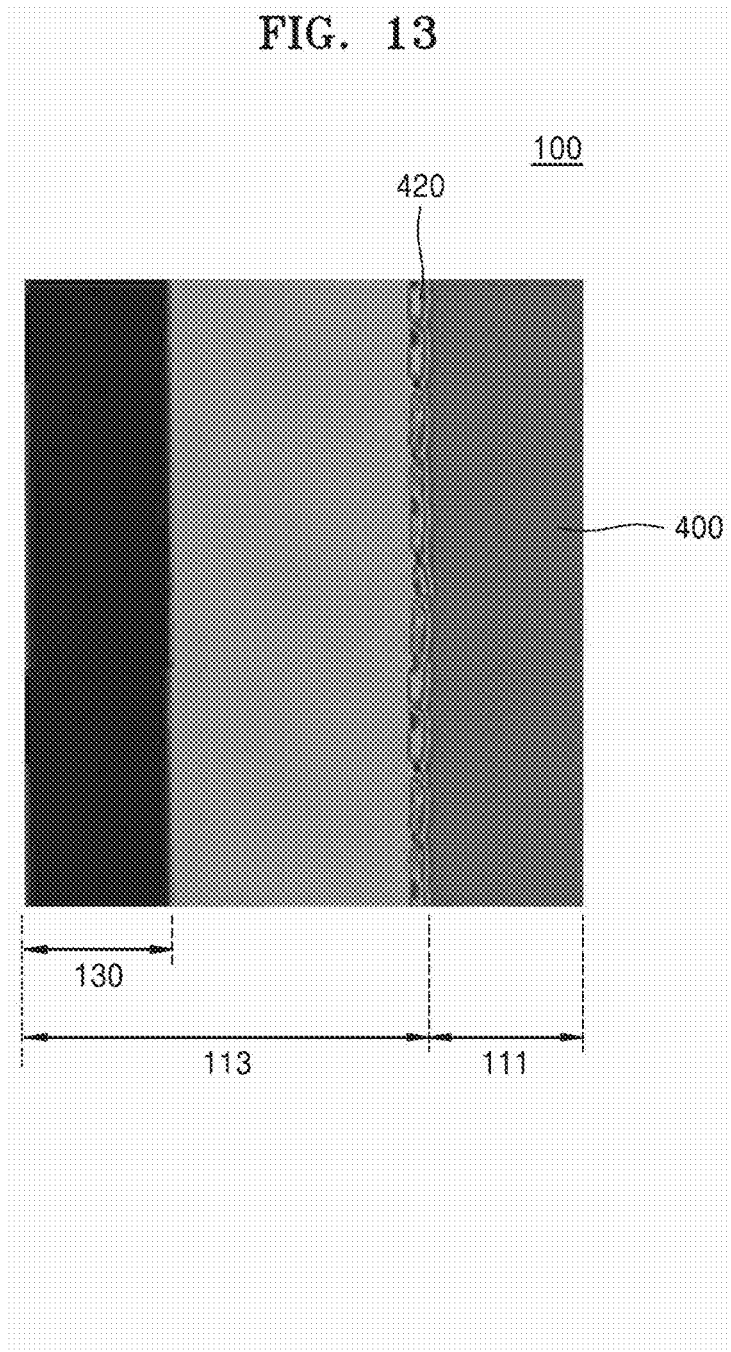
FIG. 13 illustrates an edge profile of a photoresist pattern of a chip forming area when photoresist film coating and edge etching processes are performed on a semiconductor wafer according to example embodiments.

FIG. 13 illustrates an edge profile of a photoresist pattern of a chip forming area when photoresist film coating and edge etching processes are performed on a semiconductor wafer.

In detail, as described above, the semiconductor wafer 100 may include the chip forming area 111 and the edge area 113 around the chip forming area 111. The bevel portion 130 may be formed in the edge area 113.

After a photoresist film is coated on the semiconductor wafer 100, the photoresist film in the edge area 113 including the bevel portion 130 is etched (or removed), thereby forming a photoresist pattern 400. In the semiconductor wafer 100, an edge profile 420 of the photoresist pattern 400 may be formed relatively uniformly as illustrated in FIG. 13 when a point contact (or a line contact), a bevel length, a bevel angle, etc., are optimized as described above.

Figure 14:
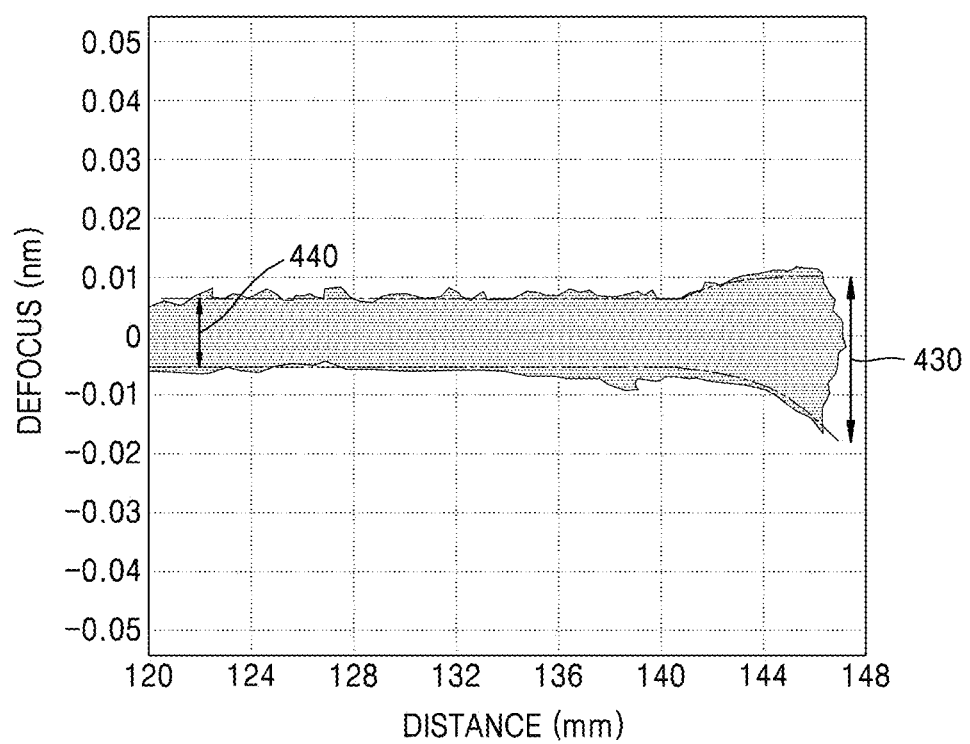
FIG. 14 is a graph showing a defocus value according to a distance from a center of a semiconductor wafer when a photolithographic process is performed after a photoresist film is coated on the semiconductor wafer.

FIG. 14 is a graph showing a defocus value according to a distance from a center of a semiconductor wafer when a photolithographic process is performed after a photoresist film is coated on the semiconductor wafer.

In detail, the X axis indicates a distance from the center of the semiconductor wafer 100 of FIG. 2. The left side of the X axis represents locates that are closer to the center of the semiconductor wafer 100 of FIG. 2. For example, FIG. 14 corresponds to a semiconductor wafer having a diameter of 300 mm, and the right side of the X axis, which indicates 148 mm, may be close to an outermost side (edge side) of the semiconductor wafer 100 of FIG. 2 having a diameter of 300 mm. The Y axis indicates a defocus value when a photolithographic process of coating a photoresist film on the semiconductor wafer 100 of FIGS. 2 to 4 is performed.

As illustrated in FIG. 14, a defocus value range 440 at the center side of the semiconductor wafer 100 of FIGS. 2 to 4 may be small, and a defocus value range 430 at the edge side of the semiconductor wafer 100 of FIGS. 2 to 4 may be large.

However, when a point contact (or line contact), a bevel length, a bevel angle, etc., are optimized as described above, as illustrated in FIG. 14, a difference between the defocus value range 440 at the center side of the semiconductor wafer 100 of FIGS. 2 to 4 and the defocus value range 430 at the edge side of the semiconductor wafer 100 of FIGS. 2 to 4 may be reduced.

Figure 15:
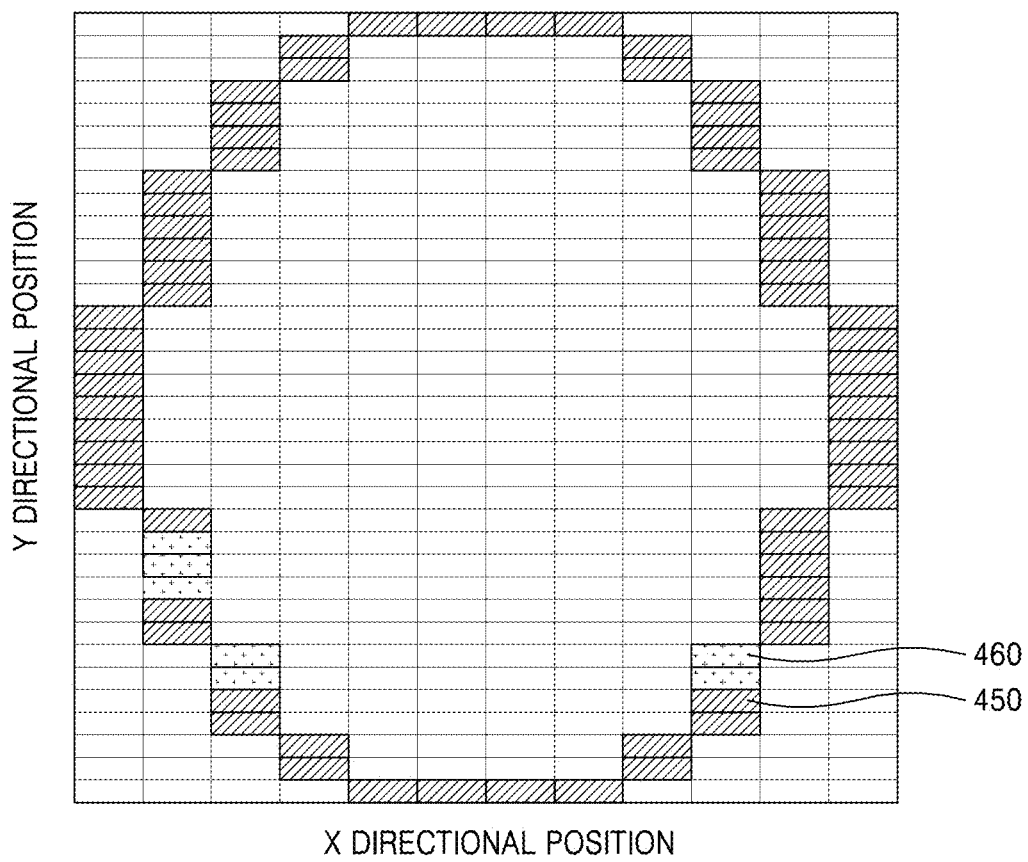
FIG. 15 is a map diagram showing flatness of a photoresist film at an edge area of the semiconductor wafer according to example embodiments.
Figure 16:
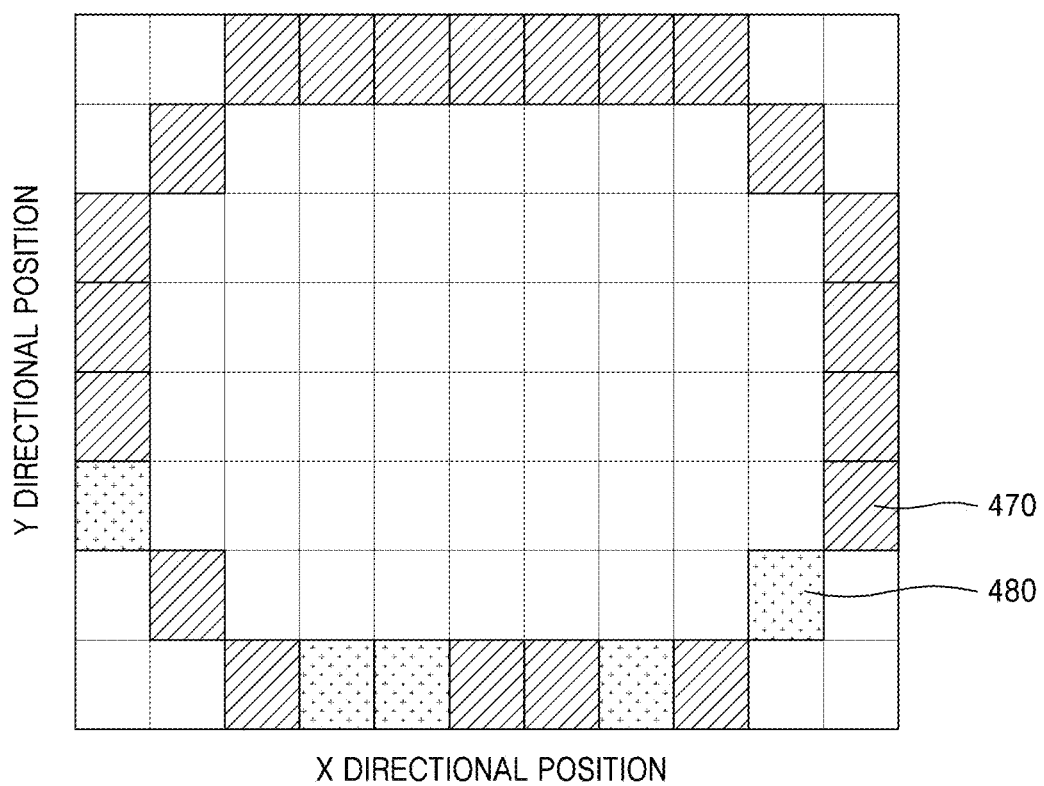
FIG. 16 is a map diagram showing a critical dimension of a photoresist pattern at the edge area of the semiconductor wafer according to example embodiments.

FIG. 15 is a map diagram showing flatness of a photoresist film at an edge area of a semiconductor wafer. FIG. 16 is a map diagram showing a critical dimension of a photoresist pattern at an edge area of a semiconductor wafer.

In detail, as illustrated in FIG. 15, it may be seen that, when a photoresist film is coated in the edge area 113 of in a semiconductor wafer 100 including the bevel portion 130 of FIG. 3, flatness is generally uniform. For example, reference numeral 450 denotes that flatness of the photoresist film is about 24 nm or less, and reference numeral 460 denotes that flatness of the photoresist film is between about 24 nm and 30 nm.

As illustrated in FIG. 16, it may be seen that, when a photoresist pattern is formed in the edge area 113 of a semiconductor wafer 100 including the bevel portion 130 of FIG. 3, a critical dimension is generally uniform. For example, reference numeral 470 denotes that a critical dimension of the photoresist pattern is about 2 nm, and reference numeral 480 denotes that a critical dimension of the photoresist pattern is between about 2 nm and 3 nm.

While example embodiments have been shown and described above, it will be apparent to those skilled in the art that modifications and variations could be made without departing from the scope of the present disclosure.

What is claimed is:

1. A semiconductor wafer comprising:
   a wafer body including a first surface and a second surface opposite the first surface; and
   a bevel portion provided along an outer circumference of the wafer body, the bevel portion including an inclined surface, an outermost point, a first surface end portion connecting the bevel portion to the first surface and a second surface end portion connecting the bevel portion to the second surface,
   wherein a first bevel angle, formed between a first tangential direction of the inclined surface and the first surface, is between approximately 30° and approximately 42° and corresponds to a capillary force of a fluid on the first surface,
   wherein a first bevel length between the first surface end portion and the outermost point along a first direction substantially parallel to the first surface corresponds to a first surface flatness, and
   wherein the bevel portion includes a point contact with an external contact member at the outermost point in a cross-sectional view.

2. The semiconductor wafer of claim 1, wherein the first bevel angle is between the first surface and a first tangent line contacting the first surface end portion in the first tangential direction.

3. The semiconductor wafer of claim 1, wherein a second bevel angle is formed between a second tangential direction of the inclined surface and the second surface.

4. The semiconductor wafer of claim 3, wherein the second bevel angle is between the second surface and a second tangent line contacting the second surface end portion in the second tangential direction.

5. The semiconductor wafer of claim 3, wherein the second bevel angle is between approximately 30° and approximately 42°.

6. The semiconductor wafer of claim 1, wherein the first bevel length is a horizontal straight distance from the first surface end portion to the outermost point, and
   wherein the first bevel length is between approximately 200 μm and approximately 295 μm.

7. The semiconductor wafer of claim 1, wherein a second bevel length is formed between the second surface end portion and the outermost point along a second direction substantially parallel to the second surface.

8. The semiconductor wafer of claim 7, wherein the second bevel length is a horizontal straight distance from the second surface end portion to the outermost point, and
   wherein the second bevel length is between approximately 200 μm and approximately 295 μm.

9. The semiconductor wafer of claim 1, wherein a thickness of the wafer body is between approximately 755 μm and approximately 795 μm, and
   wherein a length formed between a center of the wafer body and the outermost point is between approximately 465 μm and approximately 930 μm.

10. A semiconductor wafer comprising:
    a wafer body including a first surface and a second surface opposite the first surface; and a bevel portion provided along an outer circumference of the wafer body, the bevel portion including an inclined surface connecting the first surface and the second surface, wherein the bevel portion meets the first surface at a first point, the bevel portion meets the second surface at a second point, and an outermost portion of the inclined surface corresponds to a third point configured to contact an external contact member, wherein a bevel length is formed between a first virtual straight line extending from the first point to the second point and a second virtual straight line contacting the third point and parallel to the first virtual straight line, wherein a first bevel angle, formed between the first surface and a first tangent line contacting the bevel portion at the first point, is between approximately 30° and approximately 42° and corresponds to a capillary force of a fluid on the first surface, and wherein the bevel portion includes a point contact with the external contact member along the outermost portion in a cross-sectional view.

11. The semiconductor wafer of claim 10, wherein the third point is circumscribed by a virtual circle, and the first bevel angle corresponds to a radius of the virtual circle.

12. The semiconductor wafer of claim 11, wherein the bevel length is between approximately 200 µm and approximately 295 µm.

13. The semiconductor wafer of claim 12, wherein a second bevel angle between the second surface and a second tangent line of the bevel portion at the second point corresponds to the first bevel angle.

14. A semiconductor wafer comprising:
a wafer body including a first surface and a second surface opposite the first surface;
a notch portion provided along an outer circumference of the wafer body towards a center portion of the wafer body, and
a bevel portion provided along the outer circumference of the wafer body, the bevel portion including an inclined surface connecting the first surface and the second surface, wherein the bevel portion meets the first surface at a first point, the bevel portion meets the second surface at a second point, and an outermost portion of the inclined surface corresponds to a third point configured to contact an external contact member, wherein the inclined surface is located within a virtual circle circumscribing the third point, a center of the virtual circle being located in the wafer body, wherein a first bevel angle that is formed between the first surface and a first tangent line contacting the bevel portion at the first point is between approximately 30° and approximately 42° and corresponds to a capillary force of a fluid on the first surface, and wherein the bevel portion includes a point contact with the external contact member along the outermost portion in a cross-sectional view.

15. The semiconductor wafer of claim 14, wherein a bevel length is formed between a first virtual straight line extending from the first point to the second point and a second virtual straight line contacting the third point and parallel to the first virtual straight line.

16. The semiconductor wafer of claim 15, wherein the bevel length is between approximately 200 µm to about 295 µm, a radius of the virtual circle is between approximately 465 µm and approximately 930 µm, and a thickness of the wafer body is between approximately 755 µm and approximately 795 µm.

17. The semiconductor wafer of claim 14, wherein a second bevel angle is formed between the second surface and a second tangent line of the bevel portion at the second point, and wherein the second bevel angle is between approximately 30° and approximately 42°.

18. The semiconductor wafer of claim 14, wherein, a thickness of the wafer body is outside of a first range from 755 µm to 795 µm, wherein a radius of the virtual circle is within a second range in µm corresponding to:

$$(0.62)T+0.4<R<(1.2)T-26,$$

wherein T corresponds to the thickness of the wafer body, and wherein R corresponds to the radius of the virtual circle.

* * * * *